(12) United States Patent
Clair et al.

(10) Patent No.: US 8,609,979 B2
(45) Date of Patent: Dec. 17, 2013

(54) ELECTROMAGNETIC RADIATION CONCENTRATING SYSTEM

(75) Inventors: James Joseph Clair, Bay Village, OH (US); Victor George Weizer, Cleveland Heights, OH (US)

(73) Assignee: Skysun, LLC, Bay Village, OH (US)

( * ) Notice: Subject to any disclaimer, the term of this patent is extended or adjusted under 35 U.S.C. 154(b) by 70 days.

(21) Appl. No.: 12/932,185

(22) Filed: Feb. 22, 2011

(65) Prior Publication Data
US 2012/0211055 A1   Aug. 23, 2012

(51) Int. Cl.
*H01L 31/052*   (2006.01)

(52) U.S. Cl.
USPC .......... 136/246; 52/173.3; 136/244; 136/245; 136/259

(58) Field of Classification Search
USPC .......................................... 136/246; 52/173.3
See application file for complete search history.

(56) References Cited

U.S. PATENT DOCUMENTS

| 4,110,010 A * | 8/1978 | Hilton ........................... 359/853 |
| 2004/0055594 A1* | 3/2004 | Hochberg et al. ............. 126/696 |
| 2011/0155218 A1* | 6/2011 | Buchel et al. ................. 136/246 |

* cited by examiner

*Primary Examiner* — Jonathan Johnson
*Assistant Examiner* — Bethany Lambright
(74) *Attorney, Agent, or Firm* — Cindy Murphy LLC

(57) ABSTRACT

As the concentration of electromagnetic radiation, especially solar radiation, can be utilized for constructive purposes it becomes desirable to concentrate the radiation in an economical manner. An essentially fixed concentrating reflector whose shape is generated by gravity's effect on flexible members provides an efficient means to collect and concentrate radiation. Historically in optical science aberrations are to be avoided or eliminated, however this device utilizes the aberration of astigmatism. By taking advantage of the astigmatic foci created by obliquely incident radiation falling upon a substantially sphere-like primary, a comparatively large fixed concentrator can be constructed inexpensively. The resulting tangential and sagittal astigmatic foci are linear. The length of the astigmatic foci can be a substantial portion of the diameter of the concentrator, especially at times of lower solar elevation. A toric shaped deformation of the reflective surface reduces the size of the chosen astigmatic focus to yield higher concentration. In the ideal the astigmatic focus is reduced to a point. A receiver located at the reduced astigmatic focus utilizes the concentrated radiation.

13 Claims, 4 Drawing Sheets

ELECTROMAGNETIC RADIATION CONCENTRATING SYSTEM

REFERENCE TO RELATED APPLICATIONS

This application claims an invention which was disclosed in Provisional Application No. 61/284,729, filed Dec. 24, 2009, entitled "Solar radiation concentrating system and methods of construction for same". The benefit under 35 USC §119(e) of the United States provisional application is hereby claimed, and the aforementioned application is hereby incorporated herein by reference.

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISC APPENDIX

Not Applicable

BACKGROUND OF THE INVENTION

The present invention pertains generally to optical systems designed to concentrate electromagnetic radiation. Specifically, the system concentrates solar radiation for useful purposes. The invention is described in part by Patent Classification, Class 359 as defined in Section I Subsections A and B.

Ground based reflective systems concentrating electromagnetic radiation emanating from a moving source, such as the sun; require tracking reflectors, tracking receivers or both. Tracking mechanisms of various forms are typically expensive to construct and maintain. Solar radiation striking the earth has a flux, at best, of approximately 1000 watts per square meter. This density requires substantially large concentrating systems to produce useful energy in large quantities. The present invention seeks to materially decrease the costs and complexities associated with tracking and concentration.

Many patents exist which seek to decrease cost and complexity of concentration systems.

It is therefore an object of the invention to provide a solar concentrating system that is economical to construct.

It is another object of the invention to provide a solar concentrator that has a large collecting area.

It is a further object of the invention to concentrate obliquely incident solar radiation falling upon an essentially fixed reflector.

It is a further object of the invention to achieve solar concentration with fewer moving parts.

FIELD OF THE INVENTION

The nature of the invention relates to concentrators of electromagnetic radiation, and especially as a system where the primary concentrating reflector is essentially fixed, but deformable. The receiver of the concentrated radiation may be either fixed or tracking.

SUMMARY OF THE INVENTION

In the preferred embodiment the reflective surface concentrates obliquely incident solar radiation. The reflective surface may be a continuous flexible sheet, or a plurality of flat reflectors. The reflective surface is supported by flexible members such as cables. The members would hang freely between supports located at, or near the member's endpoints. The overall surface generated by the flexible members would be a portion of a catenary of revolution or catenoid. A shallow catenoid approximates the surface of a sphere. Obliquely incident radiation striking a sphere-like reflector is concentrated at the astigmatic foci. Deformation of the flexible members changes the orientation of the reflective surface. The deformation is such that radiation reflected is concentrated at the center of a chosen astigmatic focal zone. Essentially the deformation imposes a crossed cylinder warp, or toric contour on the reflective surface, correcting astigmatic aberration. The reflecting surface concentrates solar radiation at the receiver. The receiver may be fixed and placed to receive the concentrated radiation. The receiver may be tracking, such that the receiver moves to always be at the focal zone(s) as it tracks the reflected solar radiation through the day. By these means a cost efficient and large concentrating reflector may be achieved.

BRIEF DESCRIPTION OF THE DRAWINGS

The following is description of a preferred embodiment of the invention, wherein.

DETAILED DESCRIPTION OF THE INVENTION

Figure 1:
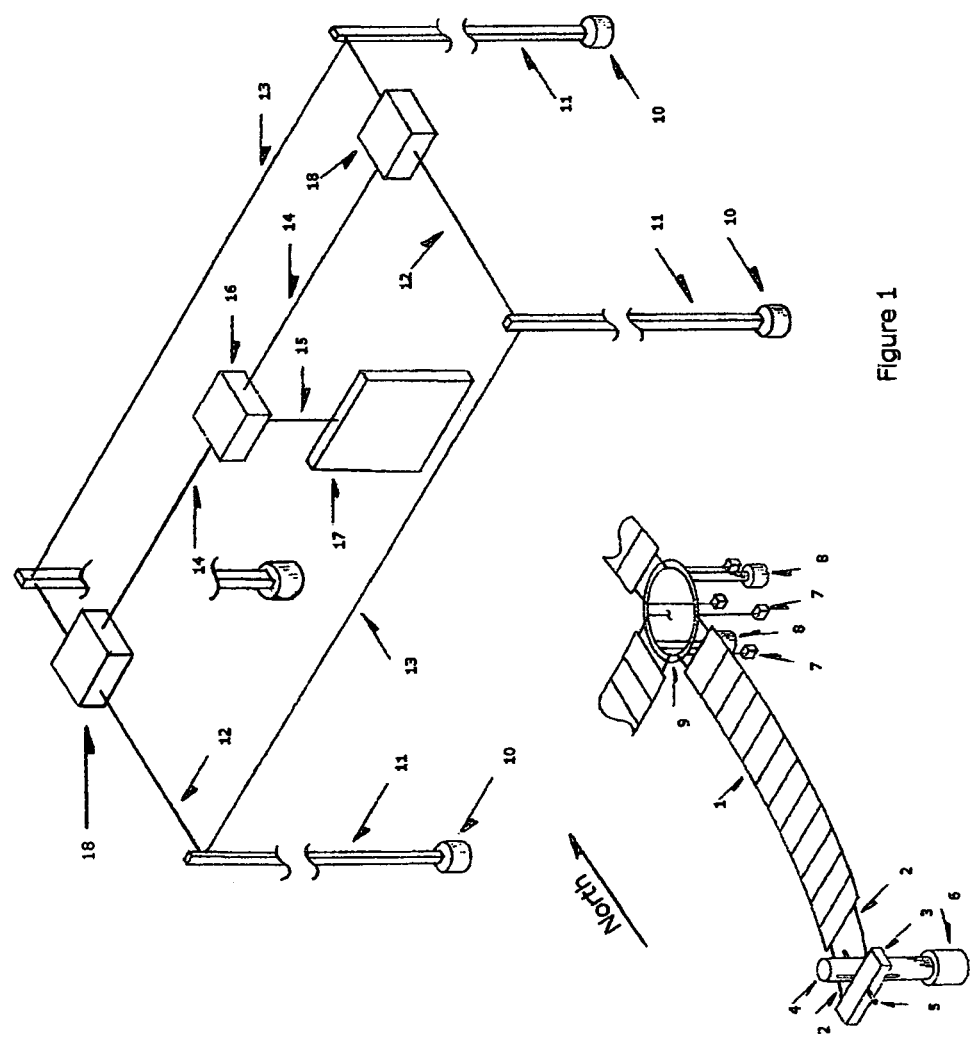
FIG. 1 is a perspective view of the concentrating system.

Referring to FIG. 1, a reflective surface 1 is comprised of a plurality of flat rigid reflectors which are supported by two flexible members 2. The individual flat reflectors connect to the flexible members 2 by use of straight hollow tubes which are firmly adhered to the bottom of the reflective surface 1. The inner diameter of a hollow tube is larger than the outside diameter of a flexible member 2 allowing for flexure. The flexible members lie principally in the horizontal. The flexible members pass through the hollow tubes, not shown.

One end of the pair of flexible members 2 terminate at the mechanism comprising: a deforming mechanism 3 which may vary vertically on shaft 4 and partially rotate about axel 5. Shaft 4 is supported by the support base 6 which is firmly attached to the earth. Vertical and rotational variation of deforming mechanism 3 is accomplished by a motor or motors interior to the deforming mechanism 3.

The pair of flexible members 2 lies upon a central annulus 9 and have their ends terminate at termination blocks 7, which are firmly anchored to the earth. Interior to the termination blocks 7 are motors or winches which vary the tension of the flexible members 2. The central annulus 9 is supported by annulus supports 8, of which two are shown. The height above ground of the central annulus 9 is always less than the height above ground of the deforming mechanism 3. The annulus supports 8 are firmly anchored to the earth.

Let the reflective surface 1, the flexible members 2, mechanism 3, 4, 5 and 6, a portion of central annulus 9 and termination blocks 7 be referred to as a strip. Many such strips may radiate outward from central annulus 9. Two other partial strips are shown. The detailed strip described above is oriented in a north-south direction. The deforming mechanism 3 is shown in the horizontal. For solar applications this orientation is appropriate for the moment when the sun is on the meridian.

When a strip or strips are in line with the solar point, the deforming mechanism 3 lies in the horizontal as shown, it is at a minimum of vertical displacement on shaft 4, and flexible members 2 are at their maximum tension. When a strip or strips are perpendicular to the solar point, the deforming mechanism 3 lies in the horizontal, it is at a maximum of vertical displacement on shaft 4, and flexible members 2 are at their minimum tension.

Other similar strips radiating out ward from the central annulus 9, and being between the in line strip and the perpendicular strip, would vary regularly between the extremes of vertical displacement on shaft 4 and tension on flexible members 2 mentioned above. The strip or strips that are neither in line with or perpendicular to the solar point would vary in the horizontal orientation of the deforming member 3. The variation would be effected by rotation of the deforming mechanism 3, by means such as a motor, about axel 5. The deforming mechanism 3 deviates maximally from the horizontal for the strip which is forty-five degrees from the solar point. The horizontal deformation of the deforming mechanism 3, the change in tension of the flexible members and the change in vertical displacement of the deforming mechanism 3 on shaft 4 warps the orientation of the strips. This warping imposes a toric shape upon the reflective surface 1 which minimizes, or in the ideal eliminates, astigmatism created by obliquely incident solar radiation. By correcting the aberration of astigmatism very high levels of concentration may be achieved.

In the preferred embodiment many strips radiate outward from the central annulus. The strips are of substantial length generating a large solar radiation collecting area.

In FIG. 1, parts 10 to 18 comprise the tracking receiver. The target 17 accepts concentrated radiation from the strip or strips. The target 17 moves in three dimensions so as to be always at the reduced astigmatic focal zone as the sun moves through the day. The target 17 is supported by target cable 15. The target 17 may rotate about an axis defined by target cable 15. This rotation allows the target 17 to be more perpendicular to the incoming concentrated radiation. Similarly, the orientation of target 17 may vary from the vertical as shown so as to be more perpendicular to the incoming concentrated radiation.

The target cable 15 terminates at a winch located in target control box 16. The winch varies the length of target cable 15 causing target 17 to vary its height above ground. The target control box 16 may move, by means of a motor interior to target control box 16, along the control box cable 14. The outer ends of control box cable 14 terminate at guide boxes 18. Guide boxes 18 move in unison, by means of motors interior to guide box 18, along guide box cables 12. Guide box cables 12 and outer cables 13 terminate near the upper portion of receiver supports 11. Receiver supports 11 are firmly attached to receiver support bases 10, which are firmly anchored to the earth. Guy wires, not shown, would increase stability of the tracking receiver. Compensation must be allowed for sagging of all cables of the tracking receiver.

The target 17 may utilize the concentrated radiation through photovoltaic means. Electrical output would be monitored by a CPU, or similar device, which would vary the orientations of the strips and tracking receiver so as to maximize the output of useful energy. The face of target 17 would be larger than an individual reflector of reflecting surface 1.

The tracking receiver is shown lying just north of the central annulus 9. This depiction would be appropriate for systems located north of the equator. For systems located south of the equator the direction south would be substituted for north in FIG. 1. For systems located at or near the equator, the tracking receiver would be approximately centered above the central annulus 9.

Two strips in line, radiating outward from the central annulus 9, define the diameter of the entire reflective surface of many strips. The sagitta of the strips, which varies throughout the day, defines the effective focal ratio range of the system. The height of receiver supports 11 would be approximately equal to the diameter multiplied by the greatest value of the focal ratio range. Both system accuracy and cost would increase with increasing focal ratios. The terrain of the system's location may be chosen to reduce construction costs.

Figure 2:
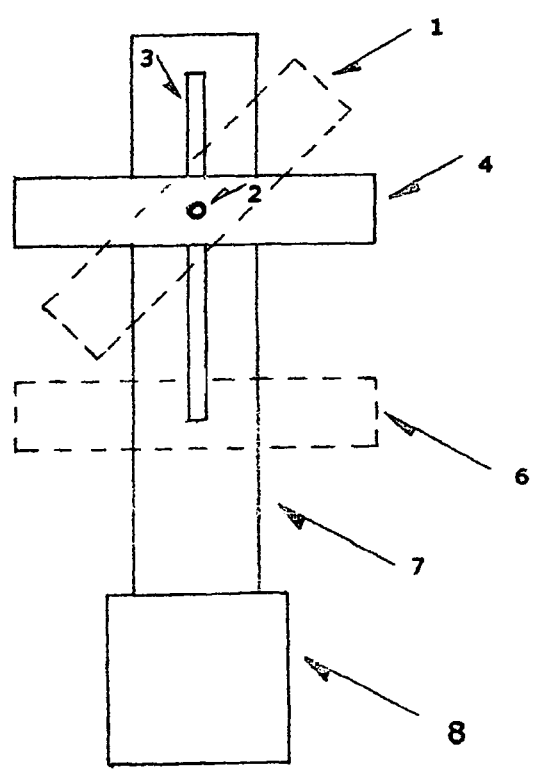
FIG. 2 is an elevational view of a mechanism.

Referring to FIG. 2, an elevation of a mechanism is shown. Viewer is placed outside the system looking toward the central annulus (not shown). The mechanism comprising: a deforming mechanism 4 which may vary vertically on shaft 7 and rotate about axel 2. Slot 3, is located at the upper portion of shaft 7. Axel 2 passes through slot 3. A pinion on axel 2 is in contact with a rack at or near slot 3. A motor interior to the deforming mechanism 4 would rotate axel 2 to vertically displace the deforming mechanism 4. The deforming mechanism 4 may be vertically displaced along slot 3. Dashed line 6 depicts the deforming mechanism 4 at its lowest vertical displacement. The deforming mechanism 4 is shown lying in the horizontal. The deforming mechanism 4 may partially rotate about axel 2. A motor interior to deforming mechanism 4 partially rotates deforming mechanism 4 about axel 2. Dashed line 1 depicts deforming mechanism 4 partially rotated about axel 2. Shaft 7 is firmly attached to the support base 8. Support base 8 is firmly attached to the earth.

Figure 3:
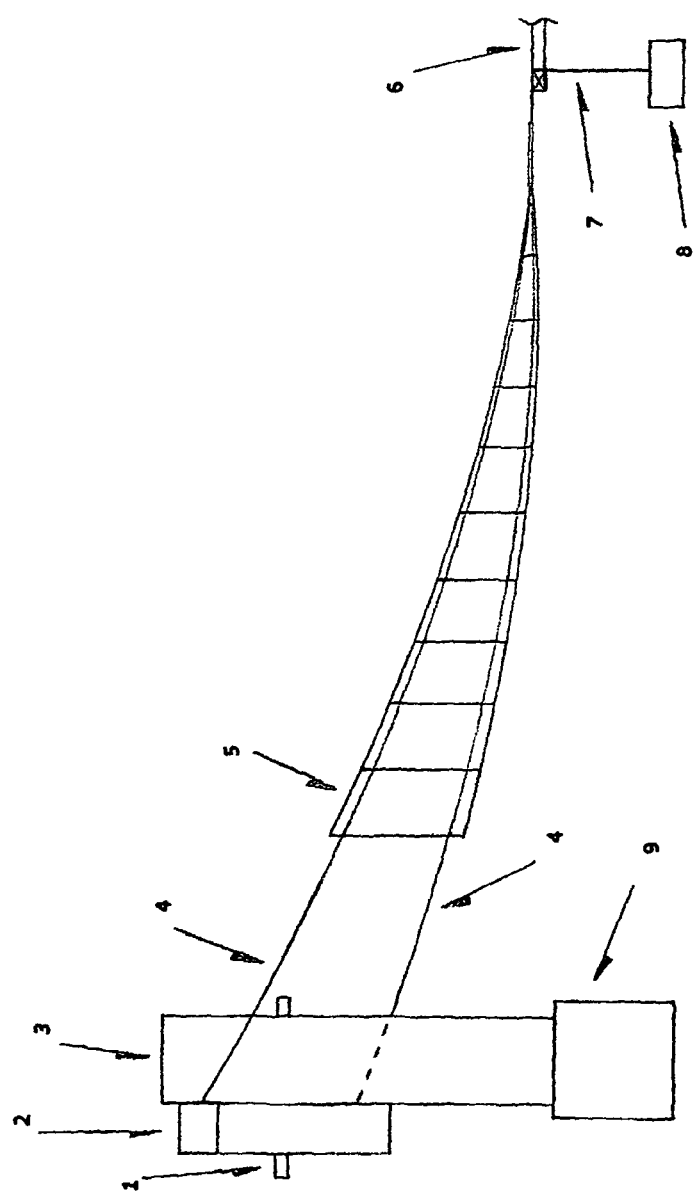
FIG. 3 is an elevational view of a mechanism, flexible members supporting a reflective surface and a portion of the central annulus.

Referring to FIG. 3, an elevation of a strip, as defined in the description of FIG. 1 is shown. Flexible members 4 carry a reflective surface comprised of a plurality of flat reflectors 5. The ends, at left, of the flexible members 4 terminate at the deforming mechanism 2. Here the deforming mechanism 2 is shown as depicted as dashed line 1 from FIG. 2. The other ends of the flexible members 4, at right, rest upon the central annulus 6. The flexible members 4 then travel vertically downward. This vertical portion of the flexible members 4 is shown as item 7. The flexible members 4 then terminate at the termination blocks 8. The underside of the plurality of flat reflectors 5 is shown. The deforming mechanism 2, when displaced from the horizontal imparts a twisting of the flexible members 4. The twisting is greatest near the deforming mechanism 2. The twisting is minimal at the central annulus 6. This twist warps the reflective surface. Many strips radiating outward from the central annulus 6 twist to greater or lesser degrees. The variation of twisting allows the reflective surface to smoothly vary between the focal ratio extremes as stated in FIG. 1's description. The warping of the many reflective strips imparts a toric curvature on the reflecting surface. The warping of the reflective surface corrects the astigmatic aberration and highly concentrates radiation at the tracking receiver.

Figure 4:
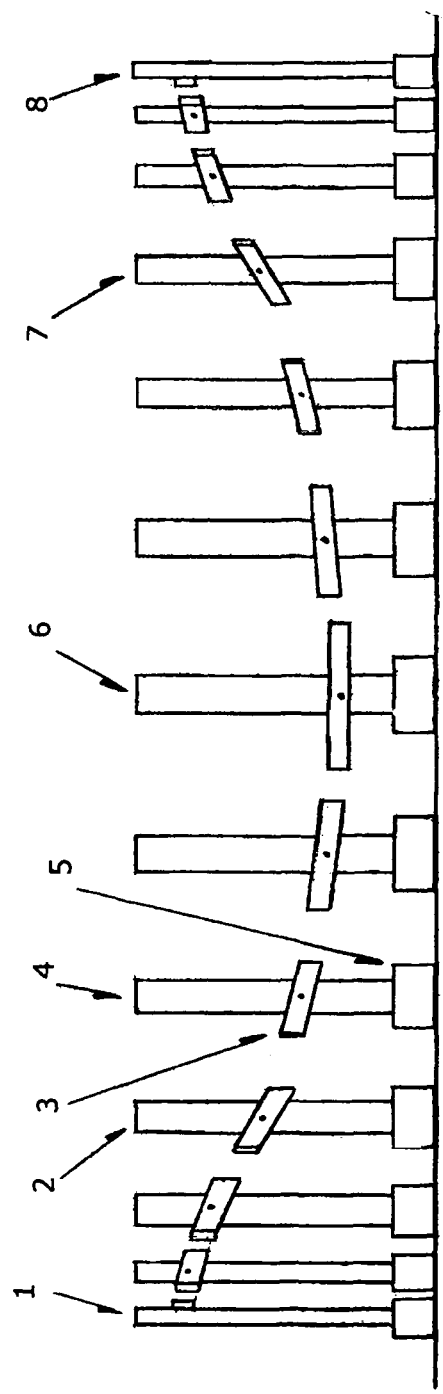
FIG. 4 is an elevational view of many mechanisms, arranged hemi-spherically about, and radiating outward from the central annulus; the central annulus is not shown.

Referring to FIG. 4, an elevation of many mechanisms is shown. The view is from near central annulus which is not shown. Thirteen similar mechanisms are shown, some of which are labeled 1, 2, 6, 7, and 8. The mechanisms are located at points radiating outward symmetrically from the central annulus. The mechanisms are equally distant from the central annulus. Each mechanism is shown with a deforming mechanism 3, a shaft 4 and support base 5. Flexible members are not shown for clarity. In practice an additional eleven mechanisms would be similarly arranged about the central annulus creating a ring of mechanisms.

Mechanisms 1 and 8 have deforming mechanisms near their highest vertical displacement. The flexible members that mechanisms 1 and 8 support would have the same tension, the tension would smallest of all other flexible members and these flexible members would describe curves with the smallest effective focal ratio of all other flexible members. Mechanism 6 has its deforming mechanism near its lowest vertical displacement. The flexible members supported by mechanism 6 would have the most tension of all flexible members and these flexible members would describe curves with the largest effective focal ratio of all other flexible members. The vertical displacement of the deforming mechanisms, such as 3, decreases smoothly from mechanism 1 to mechanism 6, and increases smoothly from mechanism 6 to mechanism 8. The deforming mechanisms, such as 3, lie in the horizontal at mechanisms 1, 6 and 8. The deforming mechanisms, such as 3, are most displaced from the horizontal at mechanisms 2 and 7. The horizontal displacement varies smoothly between mechanisms.

The above described variations in flexible member tension and horizontal orientation impart a toric shaped curvature on the reflective surface, the reflective surface comprising the many reflectors supported by the many flexible members supported by the many mechanisms. The range of the variations is determined by system location latitude, system focal ratio extremes and solar elevation. The toric shaped curvature of the reflective surface would, in effect, rotate about the central annulus, described in FIG. 1, as the solar point moves throughout the day. The degree to which the reflective surface is toric shaped varies with solar elevation throughout the day. All deforming mechanisms, and therefore the reflecting surface, are always in motion. By these means an astigmatic like line focus, created by obliquely incident radiation falling upon the reflective surface, may be greatly reduced in size.

The day over day changes in the position of the solar point are regular and relatively small. This would allow the vertical and horizontal displacements, as well as the changes in flexible member tension to be roughly controlled by a single means such as one motor driving numerous linkages. Day over day adjustments then may be accomplished with less expensive means located at the deforming mechanisms or elsewhere. Variations in individual reflector weight may be utilized to decrease the reflective surface's deviation from spherical. Other embodiments are described in the related Provisional Application referenced above.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention. The scope of the invention should not be construed as limited to solar applications.

DESCRIPTION OF RELATED ART

Patent Numbers and Application numbers:

| 20100195227 | Green, Steven Russell | |
| 20080168981 | Cummings, et al | |
| 7,192,146 | Gross, et al | March 2007 |
| 6,541,694 | Winston, et al | April 2003 |
| 5,755,217 | Stirbl, et al | May 1998 |
| 5,540,216 | Rasmusson, et al | July 1996 |
| 4,634,276 | Sharpe, et al | January 1987 |
| 4,608,964 | Russo, et al | September 1986 |
| 4,552,438 | Murphy, et al | November 1985 |
| 4,466,423 | Dolan, et al | August 1984 |
| 4,214,163 | Namae, et al | July 1980 |
| 4,173,397 | Simpson, et al | November 1979 |
| 4,162,825 | Dowty, et al | July 1979 |
| 3,574,447 | Ruble, et al | April 1971 |

RELATED LITERATURE

R W Hosken, Applied Optics Vol. 46, No. 16, June 2007 p. 3107 re: Circle of Least Confusion Bennett and Rabbett, Clinical Visual Optics, p. 81, Elsevier Health Science, 1998

M. Born, E. Wolf, Principles of Optics, Pergamon, $6^{th}$ Ed. 1980

G. S. Monk, Light, Principles and Experiments, NY. Dover, $2^{nd}$ Ed. Appdx. III p. 424, 1963

G. A. Rottigni, Concentration of the sun's rays using catenary curves, Applied Optics Vol. 17, No. 6, March 1978

A. P. Smirnov, Journal of Optics and Spectroscopy, Vol. 101, No. 3, September 2006

What is claimed is:

1. A concentrator for concentrating solar radiation onto a receiver as the solar point moves throughout a day, said concentrator comprising:

a deformable reflective surface;

a pair of vertical supports anchored to the earth;

two flexible members hanging freely between the vertical supports and supporting the deformable reflective surface so as to define its shape;

a mechanism movably mounted to one of the vertical supports and having one end of each of the flexible members attached thereto;

a rotation-adjusting linkage which changes the rotational orientation of the mechanism and thus the attached ends of the flexible members;

a tension-varying linkage which varies the tension of each of the flexible members between the vertical supports; and a controller which drives the rotation-changing linkage and the tension-varying linkage to impart a toric shaped curvature on the reflective surface to minimize astigmatic aberration due to obliquely incident radiation, this toric shaped curvature changing as the solar point moves throughout the day;

wherein the deformable reflective surface comprises a row of reflectors extending between the vertical supports;

wherein the row of reflectors are arranged end-to-end wherein each reflector of said row of reflectors is directly adjacent to at least one other reflector of said row of reflectors in a direction parallel to the direction that the flexible members extend a vertical displacing linkage which varies the vertical displacement of the mechanism, and thus the attached ends of the flexible members, wherein the controller also drives the vertical-displacing linkage; and a receiver, disposed remote to the deformable reflective surface, which receives reflected solar radiation from the reflecting surface, wherein the receiver is disposed along a cable, wherein the cable is supported by a plurality of receiver supports.

2. A concentrator as set forth in claim 1, wherein the reflective surface is exposed to the environment.

3. A concentrator as set forth in claim 1, wherein the controller comprises a single motor driving both the rotation-adjusting linkage and the tension-varying linkage.

4. A concentrator as set forth in claim 1, wherein the controller comprises a motor driving the rotation-adjusting linkage and another motor driving the tension-varying linkage.

5. A concentrator as set forth in claim 4, wherein the motor driving the rotation-adjusting linkage is interior to the mechanism.

6. A concentrator as set forth in claim 1, wherein the controller comprises a motor driving the vertical-displacing linkage.

7. A concentrator as set forth in claim 6, wherein the motor driving the vertical-displacing linkage is interior to the mechanism.

8. A concentrator as set forth in claim 1, wherein the controller comprises one motor driving both the rotation-adjusting linkage and the vertical-displacing linkage.

9. A concentrator as set forth in claim 8, wherein the one motor driving the rotation-changing linkage and the vertical-displacing linkage is interior to the mechanism.

10. A concentrator as set forth in claim 1, wherein the reflectors are flat and rigid.

11. A concentrator and a receiver as set forth in claim 1, wherein the receiver is fixed.

12. A concentrator and a receiver as set forth in claim 1, wherein the receiver is tracking.

13. A concentrator and a receiver as set forth in claim 1, wherein the receiver is exposed to the environment.

* * * * *